United States Patent [19]

Weng

[11] Patent Number: 4,866,716
[45] Date of Patent: Sep. 12, 1989

[54] REAL-TIME BCH ERROR CORRECTION CODE DECODING MECHANISM

[75] Inventor: Lih-Jyh Weng, Lexington, Mass.

[73] Assignee: Digital Equipment Corporation, Maynard, Mass.

[21] Appl. No.: 146,850

[22] Filed: Jan. 22, 1988

Related U.S. Application Data

[63] Continuation-in-part of Ser. No. 50,725, May 15, 1987.

[51] Int. Cl.[4] ............................................. G06F 11/10
[52] U.S. Cl. ..................................... 371/37.1; 371/39.1
[58] Field of Search ......................... 371/37, 38, 39, 40

[56] References Cited

U.S. PATENT DOCUMENTS

| | | | |
|---|---|---|---|
| 4,608,692 | 8/1986 | Nagumo | 371/37 |
| 4,694,455 | 9/1987 | Koga | 371/37 |
| 4,747,103 | 5/1988 | Iwamura | 371/37 |
| 4,751,704 | 6/1988 | Kojima | 371/37 |

Primary Examiner—Michael R. Fleming
Attorney, Agent, or Firm—Nutter, McClennen & Fish

[57] ABSTRACT

The invention simultaneously calculates error locations and associated error values by solving the error locator polynomial equation re-written as:

$$1 = \delta_{even}(x) + \delta_{odd}(x)$$

where $\delta_{even}(x)$ and $\delta_{odd}(x)$ are the even- and odd-power terms of the error locator polynomial. A first value of x, $x_{a1}$, is simultaneously inserted into the expression $\delta_{even}(x)$ and $\delta_{odd}(x)$ and also into an error value polynomial $\Phi(x)$. Next, while the error locator equation is evaluated at the calculated values of $\delta_{even}(x_{a1})$ and $\delta_{odd}(x_{a1})$ to determine if $x_{a1}$ is a solution, the now known values of the error evaluator polynomial $\Phi(x_{a1})$ and $\delta_{odd}(x_{a1})$ are substituted into an error value formula:

$$v = \frac{x * \Phi(x)}{\delta_{odd}(x)}$$

Thus as soon as an error location is found, the error value, $v_{a1}$, associated with that location is also known. The error can then be quickly corrected. Next, these calculated terms are used to calculate similar expressions for a next value of x, $x_{a2}$. If $x_{a2}$ is a solution, the error value $v_{a2}$ which was simultaneously calculated for $x_{a2}$ is used to correct the error. If $x_{a2}$ is not a solution, the calculated error value is ignored. The expression $\delta_{odd}(x)$, $\delta_{even}(x)$ and the polynominal $\Phi(x)$ are similarly evaluated for each of the remaining values of x.

7 Claims, 3 Drawing Sheets

REAL-TIME BCH ERROR CORRECTION CODE DECODING MECHANISM

This application is a continuation in-part of the co-pending application entitled "Apparatus for Computing Multiplicative Inverses in Error Encoding and Decoding Devices", Ser. No. 050,725 filed May 15, 1987 on behalf of the same inventor.

FIELD OF INVENTION

This invention relates to error correction code decoding mechanisms in general and more particularly to the decoding of Bose-Chaudhuri-Hocquenghem (BCH) error correction codes, including Reed-Solomon error correction codes.

DESCRIPTION OF PRIOR ART

The importance of error correction coding of data in digital computer systems has increased greatly as the density of the data recorded on mass storage media, more particularly magnetic disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is recorded on a disk, it is mathematically encoded to form ECC symbols. The ECC symbols are then appended to the data string to form code words—data symbols plus ECC symbols——and the code words are then stored on the disk. When the stored data is to be accessed from the disk, the code words containing the data symbols are retrieved from the disk and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital data can contain multiple errors. One of the most effective types of ECC used for the correction of multiple errors is a Reed-Solomon code [For a detailed description of Reed-Solomon codes, see Peterson and Weldon, *Error Correction Codes*]. Error detection and correction techniques for Reed-Solomon ECC's are well known. Id. One such technique begins with again encoding the code word data to generate ECC symbols and then comparing these ECC symbols with the ECC symbols in the code word, i.e. the ECC symbols generated by the pre-storage encoding of the data, to detect any errors in the retrieved data. [For a detailed discussion of this error detection technique, see U.S. Pat. No. 4,413,339 issued to Riggle and Weng].

The comparison of the two sets of ECC symbols is made by exclusive OR'ing ("XOR'ing") them. If there are no errors in the retrieved data, the XOR'ing will produce a string of symbols containing only zeros. If there are errors in the retrieved data, the result of the XOR'ing will be non-zero and error correction will be performed, if possible. If the number of non-zero symbols which result from the XOR'ing is less than the number of errors the code is designed to correct, all the errors are in the ECC symbols and no error correction is required. If the number of non-zero resulting symbols is equal to or greater than the number of errors the code is designed to correct, the data contains one or more errors and error correction is then performed.

In order to correct the data errors, the locations and the magnitudes or "values" of the errors must be determined. The first step in determining the error locations and the error values is to form error syndrome equations from the results of the XOR'ing of the ECC symbols. [For a detailed discussion of the generation of the error syndromes refer to U.S. Pat. No. 4,413,339 issued to Riggle and Weng]. The error syndromes are then used to generate polynomials which, when evaluated, will identify the location and the value of each of the errors.

Alternatively the error syndromes may be formed using the entire retrieved code word. This avoids the steps of re-encoding the retrieved data and comparing the ECC symbols with the retrieved ECC symbols. However, error syndromes will be generated for every code word, even those without errors, although in the latter case the syndromes will be identically zero, where there are errors, i.e. the error syndromes are not zero, the syndromes are then used to locate and correct any errors in exactly the same manner as the syndromes formed from the results of the XOR'ing of the ECC symbols. The choice between these two arrangements may, for example, depend on whether the syndromes are generated in software or hardware.

The calculation of the values of the errors is necessarily dependent on their locations. Typically, the error locations are calculated first by using the error syndromes to generate an error locator polynomial $\delta(x)$. The solutions or roots of the equation, $\delta(x)=0$, designate the locations of the errors. The roots, $x_r$, are then substituted into an error evaluator polynomial $\Phi(x)$ and the polynomial is evaluated. The results are then divided by the corresponding values of the first derivative, $\delta'(x_r)$, of the error locator polynomial to provide the values of the errors. Once both the error locations and the corresponding error values are known, the data can then be corrected.

The time it takes to perform error correction significantly affects the rate at which data can be retrieved from a storage device. As the potential for errors in stored data increases with the use of higher recording densities, the effect of slow error correction has a material effect on the average speed with which the data can be retrieved. The increased data retrieval time in turn limits the speed of all computer applications that require the retrieval of the stored data. This speed limitation occurs at a time when computer system technology advances have otherwise made possible faster data transfer operations.

What is needed is an error correction technique that can be performed significantly more quickly than the methods currently in use. Such a technique will enable computer systems to operate at the faster rates permitted by the advances in the state of the art computer technology.

SUMMARY OF THE INVENTION

The invention calculates the locations and values of the errors simultaneously and thus more quickly corrects the errors. Using this technique, errors can be corrected in "real-time" even with fast data transfer rates. The error locations and error values are found by evaluating various expressions, at values of x, where x is an element of the Galois Field used to encode the data. All values of x corresponding to possible error locations are systematically tried using an iterative evaluation technique which uses the values of each of the terms of the equations calculated for one value of x in evaluating the equations at the next value of x, in, for example, the error locator equation $$\delta(x) = 0 \qquad (1)$$

where $\delta(x)$ is the error locator polynomial, to find all the existing solutions to the equation. Each solution to the equation indicates the location of an error.

The error locator polynomial $$\delta(x) = 1 + \delta_1 * x + \delta_2 * x^2 + \ldots + \delta_n * x^n \qquad (2)$$

can be rewritten $$\delta(x) = 1 + \delta_{even}(x) + \delta_{odd}(x) \qquad (2a)$$

and equation (1) can be rewritten $$\delta_{even}(x) + \delta_{odd}(x) = 1 \qquad (1a)$$

where $\delta_{even}(x)$ and $\delta_{odd}(x)$ are the even- and odd-power terms of polynomial (2) and the $\delta$'s are calculated by the error syndrome generator. Thus the iterative evaluation technique is used to find the solutions, $x_r$, of equation (1), where $\delta(x)$ is in the form of polynomial (2a).

Solutions to polynomial (2a) are found by simultaneously inserting a first value of x, $x_{a1}$, into the expressions $\delta_{even}(x)$ and $\delta_{odd}(x)$ and also into an error value polynomial $\Phi(x)$. Next, while the error locator equation (1a) is evaluated at the calculated values of $\delta_{even}(x_{a1})$ and $\delta_{odd}(x_{a1})$ to determine if $x_{a1}$ is a solution, the now known values of the error evaluator polynomial $\Phi(x_{a1})$ and the expression $\delta_{odd}(x_{a1})$ are substituted into an error value formula $$v = \frac{x * \Phi(x)}{\delta_{odd}(x)} \qquad (3)$$

where the expression $$\frac{\delta_{odd}(x)}{x} \qquad (4)$$

represents a simplified version of the first derivative, $\delta'(x)$, of $\delta(x)$. Equation (3) is then evaluated using the method for Galois Field division disclosed in the copending application entitled "Apparatus for Computing Multiplicative Inverses in Error Encoding and Decoding Devices", Ser. No. 067,712 filed June 26, 1987. Thus as soon as an error location is found, i.e., $x_{a1}$ satisfies equation (1a), the error value associated with that location is also known. The error can then be quickly corrected.

Next, the values of expressions $\delta_{odd}(x)$, $\delta_{even}(x)$ and the polynomial $\Phi(x)$ are calculated for another value of x, $x_{a2}$. The respective terms of $\delta_{odd}(x_{a2})$, $\delta_{even}(x_{a2})$ and $\Phi(x_{a2})$ are calculated using the previously calculated terms of $\delta_{odd}(x_{a1})$, $\delta_{even}(x_{a1})$ and $\Phi(x_{a1})$, and the calculations are thus simplified.

The newly evaluated expressions $\delta_{even}(x_{a2})$, $\delta_{odd}(x_{a2})$ and polynomial $\Phi(x_{a2})$ are then substituted into the error locator equation (1a) and the error value equation (3) to determine if $x_{a2}$ is a solution, and if so, where the corresponding error is located. If $x_{a2}$ is a solution, the error value $v_{a2}$ which was simultaneously calculated for $x_{a2}$ is used to correct the error. If $x_{a2}$ is not a solution, the calculated error value is ignored. The, the expressions $\delta_{odd}(x)$, $\delta_{even}(x)$ and the polynomial $\Phi(x)$ are similarly evaluated at the other values of x. Once all the solutions are found, that is, the last error in the data is located, the data is corrected, if possible, and thus the data can then be immediately transferred. The system is then ready to process the next block of stored data.

DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

It should be understood that all addition, multiplication and division operations performed during the error correction process are Galois Field operations, the variable x is a Galois Field element of the form $\alpha^i$, where $\alpha$ is the primitive polynomial associated with a Galois Field, and the Galois Field is of the form $GF(2^p)$.

Figure 1:
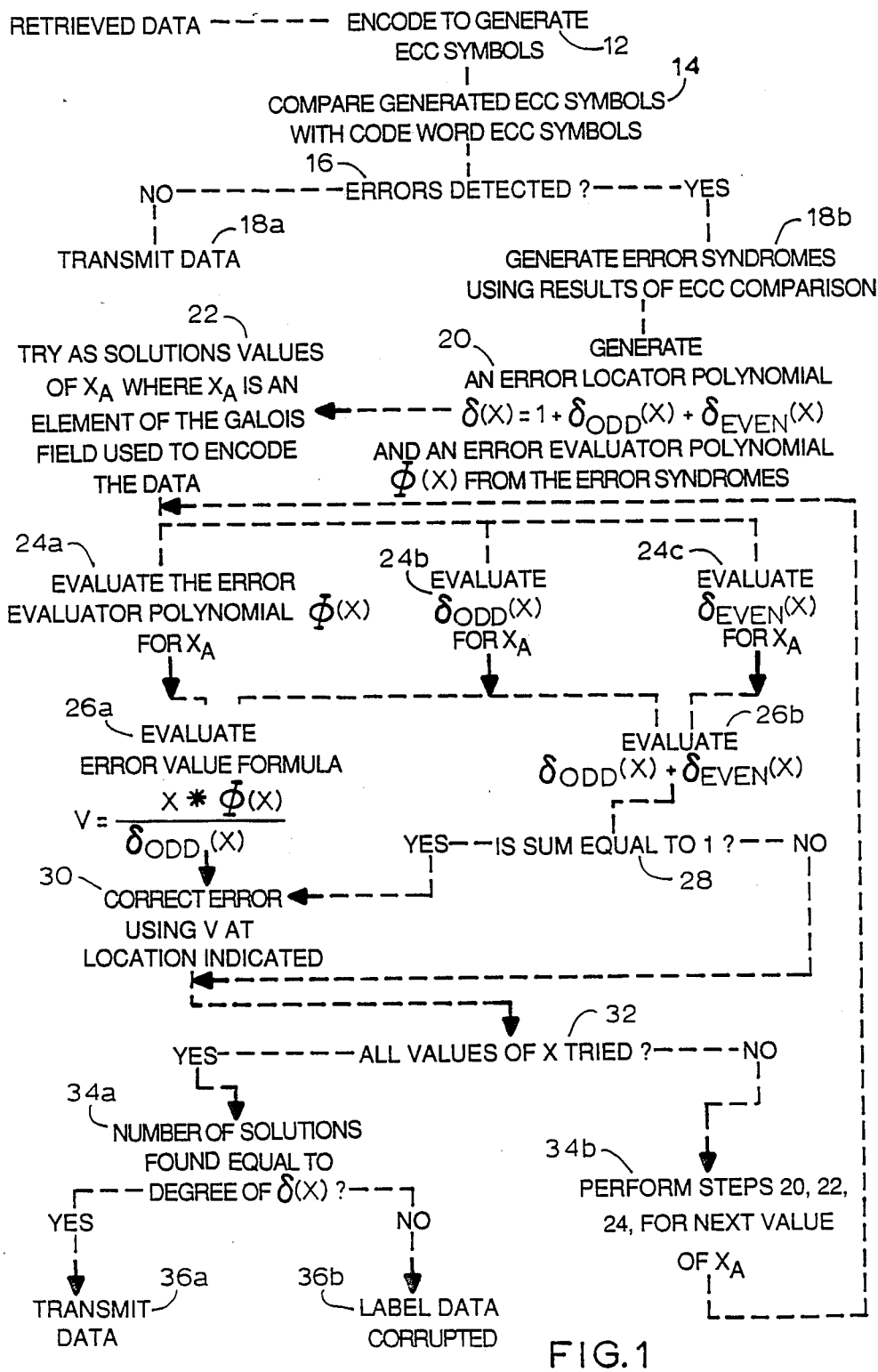
FIG. 1 is a functional block diagram of an error correcting system in accordance with the preferred embodiment of the invention. The system simultaneously determines data error locations and values and corrects the errors.
Figure 2:
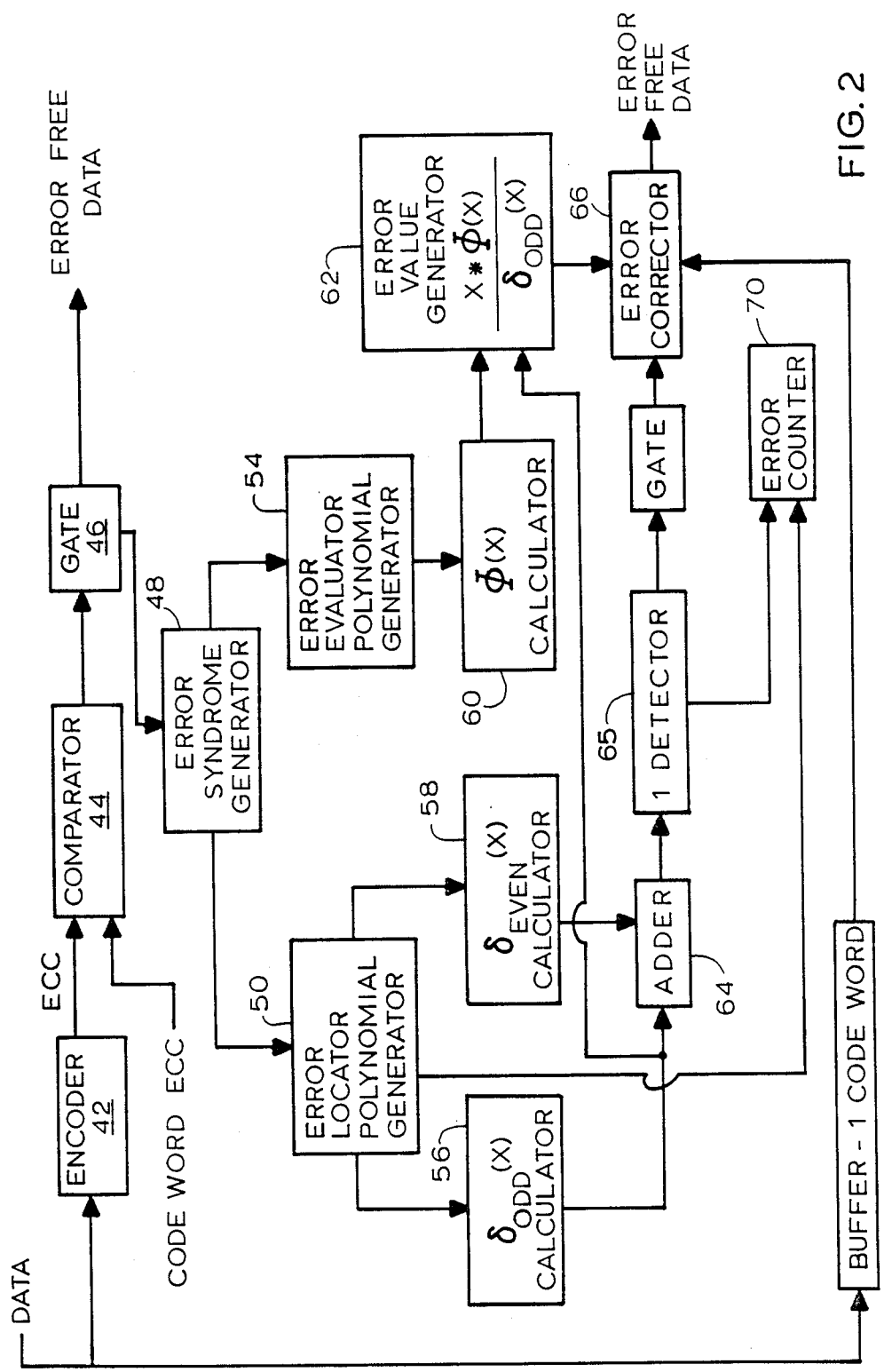
FIG. 2 is a functional block diagram of an error correction system constructed in accordance with the preferred embodiment of the invention.

With reference to FIGS. 1 and 2, a retrieved code word is first checked for the presence of any data errors (Steps 10–16), as described above. Specifically, the data portion of the retrieved code word is encoded in an encoder 42 (Step 12), and the ECC symbols generated by this encoding are compared in a comparator 44, or XOR'ed, with the code word ECC symbols. (Step 14).

If the results of the comparison indicate that there are one or more errors in the retrieved data, error correction is performed. The results of the comparison ar used to generate the error syndromes (Step 18b) in an error syndrome generator 48 which is enabled by a gate 46. The error syndromes are then utilized to generate an error locator polynomial, $\delta(x)$, and an error evaluator polynomial, $\Phi(x)$, (Step 20) in generators 50 and 54, respectively. The error locator polynomial and the error evaluator polynomial are evaluated to identify the locations and the values of the data errors.

The error locator polynomial $\delta(x)$ is defined as $$\delta(x) = 1\delta_1 * x + \delta_2 * x^2 + \ldots + \delta_n * x^n \qquad (2)$$

The locations of the errors are typically identified by the solutions of the error locator equation (1), $\delta(x) = 0$. Each root, $x_r$, of this equation identifies the location of one error.

In conventional error code correction methods, the roots of the error locator equation are substituted into an error evaluator polynomial and into the first derivative, $\delta'(x)$, of the error locator polynomial to calculate the values of the respective errors. The error evaluator polynomial $\Phi(x)$ is defined as:

$$\Phi(x) = \Phi_0 * x^0 + \Phi_1 * x^1 + \Phi_2 * x^2 + \ldots + \Phi_u * x^u \qquad (5)$$

where $u=n-1$. The value $v_r$ of an error corresponding to a root $x_r$ is given by the error value formula $$v = \frac{x^{c} * \Phi(x)}{\delta'(x)}$$

where $\delta'(x)$ is the first derivative of $\delta(x)$, and C is a constant, the value of which depends on the ECC generator polynomial selected and the roots of the generator polynomial. The generator polynomial has been selected such that $x^1$ is the lowest root, and therefore, C is equal to one. If a generator polynomial is selected which does not have $x^1$ as the lowest root, the expression $(x^{c-1}*\Phi(x))$ should be substituted for $\Phi(x)$.

Calculation of the first derivative of $\delta(x)$ can be simplified by exploiting a property of Galois Fields of characteristic 2, i.e. $GF(2^p)$. Consider polynomial (2) with n being an even number. This expression can be rewritten:

$$\delta(x) = 1 + [\delta_1*x + \delta_3*x^3 + \ldots + \delta_{n-1}*x^{n-1}] + [\delta_2*x^2 + \delta_4*x^4 + \ldots + \delta_n*x^n]$$
$$/\text{----------- odd ---------}/ \quad /\text{----------- even -------}/$$

which is
$$\delta(x) = 1 + \delta_{odd}(x) + \delta_{even}(x) \quad (2a)$$

The first derivative of polynomial (2a) is $$\delta'(x) = 0 + \delta_{odd}'(x) + \delta_{even}'(x) \quad (2b)$$

In a Galois Field of characteristic 2, the derivative of a variable "Y" raised to an even power, for example $Y^{2n}$, whose derivative is $2n*Y^{2n-1}$, is equal to zero. The derivative of $Y^{2n-1}$, however, which is $(2n-1)*Y^{2n-2}$, is non-zero; it is equal to $Y^{2n-2}$. Thus the first derivative of $\delta(x)$ can be rewritten $$\delta'(x) = 0 + \delta_1*x^0 + 3*\delta_3*x^2 + 5*\delta_5*x^4 + \ldots + (n-1)*\delta_{n-1}*x^{n-2}. \quad (6)$$

By taking advantage of the properties of Galois Fields of characteristic 2, this can be further simplified to:

$$\delta'(x) = 0 + \delta_1 + \delta_3*x^2 + \delta_5*x^4 + \ldots + \delta_{n-1}*x^{n-2} \quad (6a)$$

Formula (6a) can be further rewritten as $$\delta'(x) = \frac{\delta_{odd}(x)}{x} \quad (6b)$$

As stated above, error locations are indicated by the roots of equation (1). This equation can be rewritten, using polynomial (2a) as:

$$\delta_{even}(x) + \delta_{odd}(x) = 1 \quad (1a)$$

The corresponding error value formula will then be $$v = \frac{x * \Phi(x)}{\delta_{odd}(x)} \quad (3)$$

The solutions of equation (1a) are found by using an iterative technique to evaluate the expressions $\delta_{odd}(x)$ and $\delta_{even}(x)$ for successive values of x in calculators 56 and 58, respectively. For each such evaluation, the values of $\delta_{odd}(x)$ and $\delta_{even}(x)$ are then added to determine if the sum is equal to 1.

Basically, the iterative technique tries the values of x, where x represents possible locations of errors in the encoded data, in a specified order, as solutions to equation (1a), until all the values of x have been tried. At the same time that the expressions $\delta_{odd}(x)$ and $\delta_{even}(x)$ are being evaluated at each value of x, the iterative technique is used to evaluate the error evaluator polynomial $\Phi(x)$ at the same x value in calculator 60. The iterative technique is discussed in detail in connection with FIG. 3.

Continuing with reference to FIGS. 1 and 2, an adder 64 sums the evaluations of $\delta_{odd}(x_{a1})$ and $\delta_{even}(x_{a1})$. At the same time, results of the evaluations of the error evaluator polynomial $\Phi(x)$ and the expression $\delta_{odd}(x)$ are substituted into the error value formula (3) (Step 28) and the error value is calculated in an error generator 62. The generator 62 may, for example, use the method for Galois Field division disclosed in the co-pending U.S. patent application entitled "Apparatus for Computing Multiplicative Inverses in Error Encoding and Decoding Devices", Ser. No. 067,712 filed on June 26, 1987.

The output of adder 64 is applied to a one-detector 65, which asserts its output whenever $\delta_{odd}(x) + \delta_{even}(x) = 1$, that is, whenever a particular x is a root of equation (1a) (Step 32). The asserted output of the one-detector 65 enables an error corrector 66 which quickly corrects the error with the then known error value v obtained from the generator 62. If a particular x is not a root of equation (1a), the output of the one-detector 65 is not asserted and the calculated error value v is disregarded, that is, the error corrector 66 is not enabled. The process is continued until all the values of x corresponding to possible error locations have been tried as solutions to equation (1a) (Steps 36, 38).

If, after all values of x corresponding to possible error locations have been tried (Step 36), the number of solutions found for equation (1a), which are totaled in a counter 70, is equal to the degree of the error locator polynomial $\delta(x)$, the corrected data is passed to the circuitry requesting the data. If the number of solutions found for equation (1a) is less than the degree of the error locator polynomial $\delta(x)$, the data is labeled uncorrectable.

Figure 3:
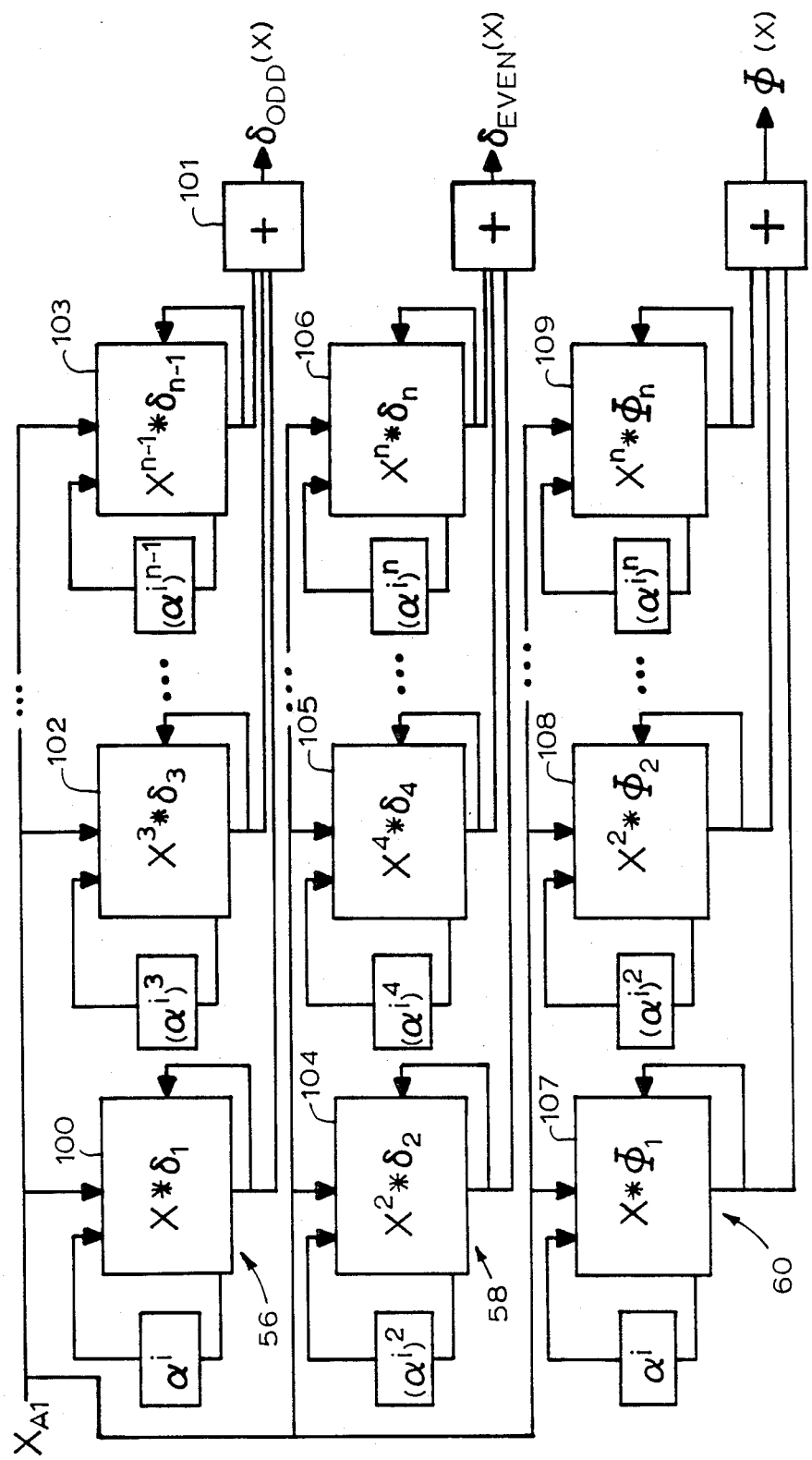
FIG. 3 is a functional block diagram of the calculators shown in FIG. 2.

FIG. 3 illustrates the iterative technique used in evaluating the expressions $\delta_{odd}(x)$, $\delta_{even}(x)$ and the polynomial $\Phi(x)$ in calculators 56, 58, and 60, respectively. Calculator 56 contains a plurality of Galois Field multipliers 100, 102 and 103. Each Galois Field multiplier computes the values of a particular term of $\delta_{odd}(x)$ at various values of x. Thus multiplier 100 calculates the value of $x*\delta_1$, multiplier 102 calculates $x^3*\delta_3$, etc. The calculated values of each of the terms at a particular x are stored in the multipliers and then added modular 2 in a summer 101 to evaluate $\delta_{odd}(x)$.

Specifically, to evaluate $\delta_{odd}(x)$ at various x's the multipliers 100, 102 and 103 are set to an initial condition using the $\delta_{odd}(x)$ terms. Multiplier 100, for example, is set to $\delta_1$, and multiplier 102 is set to $\delta_3$. Next, to calculate the values of the $\delta_{odd}(x)$ terms at a first value of x, $x_{a1}$, where $x_{a1}$ is typically $\alpha$, the contents of the multipliers are multiplied by the constants $\alpha, \alpha^3 \ldots, \alpha^{n-1}$, respectively. Thus, for example, the $\delta_{n-1}$ term is multiplied by the constant $\alpha^{n-1}$ to calculate the value of $(x_{a1})^{n-1}*\delta_{n-1}$. The products are then stored in the multipliers, and added by the summer 101 to calculate $\delta_{odd}(x_{a1})$.

Thereafter, to calculate the value of $\delta_{odd}(x)$ at the next value of x, $x_{a2}$, i.e. $\alpha^2$ if $x_{a1}=\alpha$, the contents of the multipliers are again multiplied by the constants $\alpha$, $\alpha^3$, $\alpha^5 \ldots \alpha^{n-1}$, respectively, the products are stored in the multipliers, and the stored terms are again added to calculate $\delta_{odd}(x_{a2})$. This calculation process is repeated until $\delta_{odd}(x)$ is calculated for all values of x corresponding to possible error locations.

Calculators 58 and 60 (FIG. 2), consisting of Galois Field multipliers 104-109, operate similarly to calculate the values of $\delta_{even}(x)$ and $\Phi(x)$ at the various values of x.

If the first value of x tried as a solution is $x_n$, rather than $x_1$, the constants used in the respective multipliers are $\alpha^{-1}$, $\alpha^{-2}$, $\alpha^{-3} \ldots \alpha^{-n}$.

Evaluating the expressions $\delta_{odd}(x)$, $\delta_{even}(x)$ and $\Phi(x)$ for the various values of x is simplified using the iterative evaluation technique. The iterative evaluation technique is adapted from the well-known Chien search technique.

Ascertaining the locations and the values of the data errors simultaneously provides that the errors can be quickly and efficiently corrected. Using conventional techniques for the individual components of the process, the error locations are first calculated and then the error values are found, and only after these two calculations have been performed can the errors be corrected. Moreover, the technique described above takes advantage of the properties of Galois Fields $GF(2^p)$ to simplify the evaluation of the first derivative of the error locator polynomial, and thus the calculation of the error values is simplified and quickened. The ability to simultaneously ascertain the locations and values of the data errors and to then immediately correct them permits a computer system to take advantage of faster transfer rates which are technologically feasible.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A method of correcting data which is encoded into code words using a BCH error correction code based on Galois Field $GF(2^p)$ and a selected generator polynomial, said method comprising the steps of:
   A. generating error syndromes corresponding to a given data code word containing errors;
   B. using said error syndromes, generating an error evaluator polynomial $\Phi(x)$ and an error locator polynomial $\delta(x)$ of the form $\delta(x)=1+\delta_{even}(x)+\delta_{odd}(x)$, where $\delta_{even}(x)$ and $\delta_{odd}(x)$ are the even- and odd- terms of $\delta(x)$, respectively;
   C. for each successive value of x, which are each elements of $GF(2^p)$ corresponding to possible locations of errors in the code word, simultaneously substituting x into expressions for the error evaluator polynomial, $\Phi(x)$, and $\delta_{even}(x)$ and $\delta_{odd}(x)$;
   D. evaluating said expressions;
   E. substituting the results of step D into the error locator polynomial and an error value formula;
   F. evaluating said error locator polynomial and said error value formula to obtain the location of a possible error in the code word and a corresponding error value, respectively;
   G. (a) if said error locator polynomial is equal to one for a given x, indicating that there is an error at the code word location corresponding to x, correcting the error with the corresponding calculated error value, or (b) if said error locator polynomial is not equal to one for a given x, indicating that there is no error at the code word location corresponding to x, disregarding the corresponding calculated error value; and
   H. repeating steps C-G for all remaining values of x corresponding to possible error locations in the code word.

2. The method for correcting errors in claim 1 wherein:
   A. if the generator polynomial has $x^1$ as a root, said error value formula for determining the value of an error, v, at the code word location corresponding to x is:

$$v = \frac{x * \Phi(x)}{\delta_{odd}(x)}$$

and

B. if the generator polynomial does not have $x^1$ as a root, said error value formula for determining the value of an error, v, at the code word location corresponding to x is:

$$v = \frac{x^c * \Phi(x)}{\delta_{odd}(x)}$$

where C is a constant which depends on the generator polynomial.

3. The method for correcting errors in claim 2 wherein the error correction code used to encode the data is a Reed-Solomon code.

4. The method for correcting errors in claim 2 wherein said error evaluation polynomial and error locator expressions for determining the location and value of errors in a data code word are evaluated using an iterative evaluation method comprising the steps of:
   A. calculating the values of the terms of the two error locator expressions $\delta_{even}(x)$ and $\delta_{odd}(x)$ and the values of the terms of the error evaluator polynomial $\Phi(x)$ for a first value of x corresponding to a given code word location;
   B. storing the calculated value of each term of the error locator expressions and the error evaluator polynomial;
   C. substituting the stored values into the error locator polynomial and the error value formula to determine the locations and values of errors in the code word corresponding to x;
   D. to try a next value of x corresponding to another possible error location, multiplying each stored value by a constant $B^n$, where:
      i. x * B is equal to the next value of x to be tried, and
      ii. n is the exponent of the variable in the term having that value; and E. repeating steps B-D for each x corresponding to a possible error location.

5. An apparatus for correcting data which is encoded into code words using a BCH error correction code based on Galois Field GF($2^p$), comprising:

A. an error syndrome generator for generating error syndromes;

B. a polynomial generator connected to receive the error syndromes for generating, using the error syndromes, an error evaluator polynomial $\Phi(x)$ and an error locator polynomial $\delta(x)$ of the form $\delta(x)=1+\delta_{even}(x)+\delta_{odd}(x)$, where $\delta_{even}(x)$ and $\delta_{odd}(x)$ are the even- and odd- terms of $\delta(x)$, respectively;

C. code word error correction means for locating the errors in the code word and correcting them, said code word error correction means including:

1. first substitution means for, for each successive value of x, which are elements of GF($2^p$) corresponding to possible error locations in the code word, simultaneously substituting x into expressions for the error evaluator polynomial $\Phi(x)$, $\delta_{even}(x)$ and $\delta_{odd}(x)$;

2. first evaluating means for evaluating said expressions at the substituted values of x;

3. second substitution means for substituting the values of the evaluated expressions into the error locator polynomial and an error value formula;

4. second evaluating means for evaluating said error locator polynomial and said error value formula to obtain the locations of errors in the code word and corresponding error values; and 5. correcting means for
   (1) if said error locator polynomial is equal to one, correcting the error at the code word location corresponding to x using the calculated error value, or
   (2) if said error locator polynomial is not equal to one, disregarding the calculated error value;

6. repeating steps 1-5 for all remaining values of x corresponding to possible error locations in the code word.

6. The apparatus for correcting errors in claim 5 wherein said error value formula into which the first substitution means substitutes the calculated expression value is $$v = \frac{x * \Phi(x)}{\delta_{odd}(x)}$$

if the generator polynomial has $x^1$ as the lowest root the error value formula, or $$\frac{x^c * \Phi(x)}{\delta_{odd}(x)}$$

if the generator polynomial does not have $x^1$ as the lowest root the error value formula, where C is a constant which depends on the generator polynomial.

7. The apparatus for correcting errors in claim 6, wherein said first evaluating means includes:

1. calculating means for calculating the values of the terms of the two error locator expressions $\delta_{even}(x)$ and $\delta_{odd}(x)$ and the values of the terms of the error evaluator polynomial for a first value of x corresponding to a given code word location;

2. storage means for storing the calculated values of each of the terms of the error locator expressions and the error evaluator polynomial and applying said values to said second substitution means; and 3. multiplication means for calculating a next value of x corresponding to another possible error location by multiplying each of the stored values by a constant where:
   i. x * B is equal to the next value of x to be tried, and
   ii. n is the exponent of the variable in the term having that value.

* * * * *

UNITED STATES PATENT AND TRADEMARK OFFICE
CERTIFICATE OF CORRECTION

PATENT NO. : 4,866,716

DATED : Sept. 12, 1989

INVENTOR(S) : Lih-Jyh Weng

It is certified that error appears in the above-identified patent and that said Letters Patent is hereby corrected as shown below:

TITLE PAGE: Line 22 of the abstract delete "polynominal" and insert --polynomial--;

In column 2 line 18 delete "zero, where" and insert --zero. Where--;

In column 3 line 68 delete "The, the" and insert --Then,the--;

In column 4 line 42 delete "ar" and insert --are--;

In column 4 line 54 correct the formula which reads
"$\delta(x)=1\delta_1{}^*x+\delta_2{}^*x^2+...+\delta_n{}^*x^n$" to read --
$\delta(x)=1+\delta_1{}^*x+\delta_2{}^*x^2+...+\delta_n{}^*x^n$--;

In column 6 line 16 insert the word value between "error" and "generator";

In column 10 line 35 insert --$B^n$--, after the word "constant".

Signed and Sealed this

Thirtieth Day of July, 1991

Attest:

HARRY F. MANBECK, JR.

*Attesting Officer*      *Commissioner of Patents and Trademarks*